US012652809B2

(12) United States Patent
Chia et al.

(10) Patent No.: US 12,652,809 B2
(45) Date of Patent: Jun. 9, 2026

(54) SEMICONDUCTOR DEVICE AND METHOD OF FABRICATING THE SAME

(71) Applicant: Taiwan Semiconductor Manufacturing Company, Ltd., Hsinchu (TW)

(72) Inventors: Han-Jong Chia, Hsinchu City (TW); Shih-Peng Tai, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 617 days.

(21) Appl. No.: 18/152,171

(22) Filed: Jan. 10, 2023

(65) Prior Publication Data

US 2024/0114702 A1      Apr. 4, 2024

Related U.S. Application Data

(60) Provisional application No. 63/412,552, filed on Oct. 3, 2022.

(51) Int. Cl.
| | |
|---|---|
| *H10B 80/00* | (2026.01) |
| *H10B 61/00* | (2023.01) |
| *H10N 50/01* | (2023.01) |
| *H10N 50/20* | (2023.01) |
| *H10N 50/80* | (2023.01) |

(52) U.S. Cl.
CPC ............. *H10B 80/00* (2023.02); *H10B 61/00* (2023.02); *H10N 50/01* (2023.02); *H10N 50/20* (2023.02); *H10N 50/80* (2023.02)

(58) Field of Classification Search
CPC .......... H01L 2225/06503; H10B 61/00; H10B 80/00
See application file for complete search history.

(56) References Cited

U.S. PATENT DOCUMENTS

| | | | | |
|---|---|---|---|---|
| 2020/0395341 | A1* | 12/2020 | Maejima | H01L 24/08 |
| 2021/0175284 | A1* | 6/2021 | Ouellette | H01F 41/303 |
| 2022/0059480 | A1* | 2/2022 | Park | H01L 25/0657 |

* cited by examiner

*Primary Examiner* — Shih Tsun A Chou
(74) *Attorney, Agent, or Firm* — JCIPRNET

(57) ABSTRACT

A semiconductor device includes a first substrate, a transistor, an interconnection structure, a first bonding pad, a magnetic tunnel junction (MTJ) structure, a conductive line and a second substrate. The transistor is formed on the first substrate. The interconnection structure is formed on the first substrate and electrically connected to the transistor. The first bonding pad is formed on and electrically connected to the interconnection structure. The MTJ structure is disposed on and electrically connected to the first bonding pad, wherein the MTJ structure comprises a free layer, a tunnel barrier layer, a synthetic antiferromagnet layer sequentially stacked up over the first bonding pad. The conductive line is disposed on the MTJ structure. The second substrate is disposed on the conductive line.

20 Claims, 16 Drawing Sheets

SEMICONDUCTOR DEVICE AND METHOD OF FABRICATING THE SAME

CROSS-REFERENCE TO RELATED APPLICATION

This application claims the priority benefit of U.S. provisional application Ser. No. 63/412,552, filed on Oct. 3, 2022. The entirety of the above-mentioned patent application is hereby incorporated by reference herein and made a part of this specification.

BACKGROUND

Magnetic random access memory (MRAM) is one of the leading candidates for next-generation memory technologies that aim to surpass the performance of various existing memories. MRAM offers comparable performance to volatile static random access memory (SRAM) and comparable density with lower power consumption to volatile dynamic random access memory (DRAM). As compared to non-volatile flash memory, MRAM offers much faster access speed and suffers minimal degradation over time. In general, MRAM stores data using storage elements such as magnetic tunnel junction (MTJ), and the MTJ is typically coupled in series with a control device such as a transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
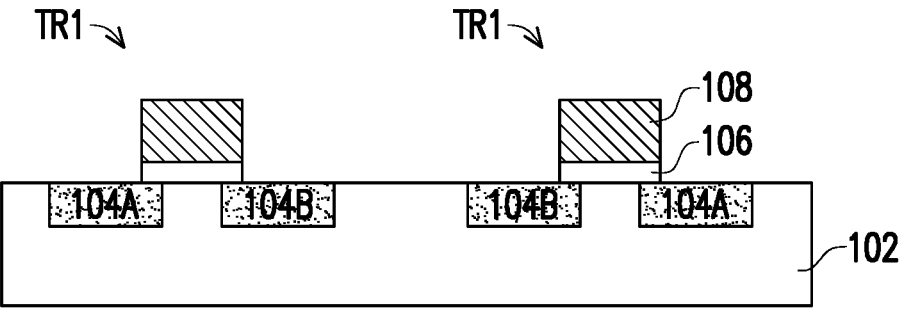
FIG. 1A to FIG. 1D are schematic sectional views of various stages in a method of fabricating a first stacked structure according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Conventional spin transfer torque magnetoresistive random access memory (MRAM) consists of an access/drive transistor and a magnetic tunnel junction (MTJ) located above the transistor. The MTJ typically consists of a synthetic antiferromagnet (SAF) layer which acts as a pinned layer to provide spin polarization while simultaneously zeroing out the net magnetic field of the MTJ. In general, a tunnel barrier layer is located above the SAF layer to read the memory, while a free layer which acts as a storage layer is located above the tunnel barrier layer. In the above configuration, the parallel to antiparallel switching current is larger than the antiparallel to parallel current due to the weak reflected spin polarization of parallel to antiparallel switching. This asymmetry, however, is the opposite of the write current asymmetry of the access transistor. Thus, to compensate for the different asymmetries, the write transistor drive current must be increased, resulting in a larger transistor area and a reduction in device density. In some embodiments of the present disclosure, a method of fabricating a semiconductor device is proposed where the access transistor and the MTJ are constructed on separate substrates. The method can realize the advantages of a top pinned stack, while simultaneously benefiting from the growth of the SAF on the seed layer.

FIG. 1A to FIG. 1D are schematic sectional views of various stages in a method of fabricating a first stacked structure according to some exemplary embodiments of the present disclosure. Referring to FIG. 1A, a first substrate 102 is provided. The first substrate 102 may be a semiconductor substrate, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including silicon germanium (SiGe), GaAsP, AlInAs, AlGaAs, GaInAs, GaInP, and/or GaInAsP; or combinations thereof. Other substrates, such as multi-layered or gradient substrates, may also be used.

In some embodiments, multiple transistors TR1 are formed on the first substrate 102. For example, the transistors TR1 are planar field effect transistor (FET) or Fin Field-Effect Transistors (FinFETs). In some other embodiments, the transistors TR1 may be alternatively formed as gate-all-around (GAA) transistors. In some embodiments, when the transistors TR1 are FinFETs, then the first substrate 102 may include multiple fins (not shown) formed thereon. As illustrated in FIG. 1A, the transistors TR1 include source regions 104A, drain regions 104B, gate dielectric layers 106 and gate electrodes 108. The source regions 104A and the drain regions 104B (or source and drain 104A, 104B) are formed in the first substrate 102 on either side of the gate electrode 108 (or word lines). For example, the source regions 104A and the drain regions 104B are implanted regions of the first substrate 102, or epitaxial material grown in recesses formed in the first substrate 102.

In some embodiments, the first substrate 102 may be doped with p-type dopants or n-type dopants. For example, the source regions 104A and the drain regions 104B may be doped with p-type dopants, such as boron or $BF_2$; n-type dopants, such as phosphorus or arsenic; and/or combinations thereof. Depending on the types of the dopants in the doped regions, the transistors TR1 may be referred to as n-type transistor or p-type transistor. In some embodiments, the gate electrodes 108 are disposed on the first substrate 102 over the source regions 104A and the drain regions 104B, while the gate dielectric layers 106 are disposed below the gate electrodes 108. In some embodiments, a channel region (not shown) is located between the source regions 104A and the drain regions 104B to serve as a path for electron to travel when the transistor TR1 is turned on. In certain embodiments, spacers (not shown) may be disposed on the sidewalls of the gate electrodes 108.

Figure 1B:
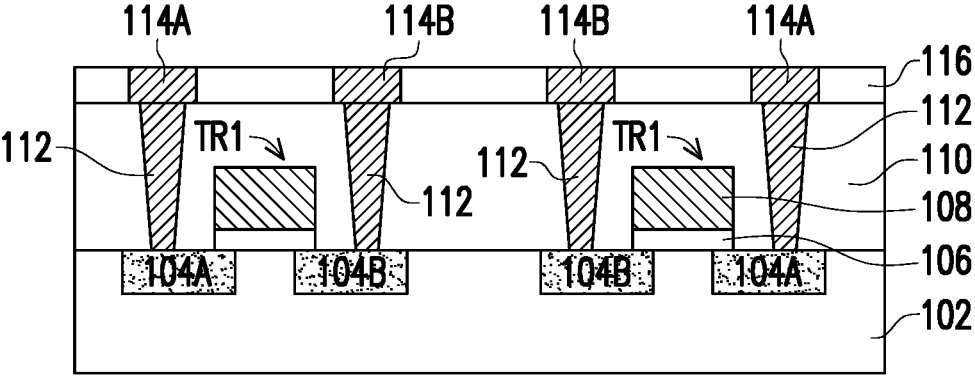

Referring to FIG. 1B, in some embodiments, a dielectric layer 110 is formed over the first substrate 102 to surround the gate dielectric layers 106 and the gate electrodes 108 of the transistors TR1. The dielectric layer 110 may be formed of any suitable dielectric material including, for example, a nitride such as silicon nitride, an oxide such as silicon oxide, SiOC, and SiOCN, SiCN, phosphosilicate glass (PSG), borosilicate glass (BSG), boron-doped phosphosilicate glass (BPSG), the like, or combinations thereof. The dielectric layer 110 may be formed using any acceptable deposition process, such as spin coating, physical vapor deposition (PVD), chemical vapor deposition (CVD), the like, or a combination thereof. In some embodiments, the dielectric layer 110 may be a low-k dielectric material, such as a dielectric material having a dielectric constant (k value) lower than about 3.0, for example.

In some embodiments the dielectric layer 110 may be patterned to form openings revealing the source regions 104A and the drain regions 104B. For example, the dielectric layer 110 may be patterned using a suitable photolithography and etching process to form the openings. Thereafter, a plurality of conductive vias 112 (or contact plugs) are formed in the openings to make electrical connection to the source regions 104A and the drain regions 104B. In some embodiments, the conductive vias 112 are formed by depositing a barrier layer (not shown) extending into the openings, then depositing a conductive material over the barrier layer. Subsequently, a planarization process such as a chemical mechanical polishing (CMP) process or a grinding process may be performed to remove excess portions of the blanket conductive barrier layer and the conductive material. The barrier layer or the conductive material of the conductive vias 112 may be formed using a suitable process such as chemical vapor deposition (CVD), physical vapor deposition (PVD), atomic layer deposition (ALD), plating, or the like. The barrier layer, if used, may be formed of any suitable material, such as TiN, Ti, TaN, Ta, the like, or combinations thereof.

After forming the conductive vias 112 in the dielectric layer 110, a dielectric layer 116 as well as conductive lines 114A (e.g. source lines) and landing pads 114B are formed over the dielectric layer 110. The dielectric layer 116 is laterally surrounding the conductive lines 114A and the landing pads 114B. In some embodiments, the conductive lines 114A are connected to the source regions 104A of the transistors TR1 through the conductive vias 112, while the landing pads 114B are connected to the drain regions 104B of the transistors TR1 through the conductive vias 112. In some embodiments, the dielectric layer 116 may be formed of the same material and formed by a similar method to that of the dielectric layer 110. Therefore, its detailed description will be omitted herein.

In some embodiments the conductive lines 114A and the landing pads 114B are formed using a suitable technique such as damascene, dual-damascene, plating, deposition, the like, or combinations thereof. In some embodiments, the conductive lines 114A and the landing pads 114B may be formed by patterning the dielectric layer 116 to form openings (not shown), and then filling the openings in the dielectric layer 116 with conductive material. In some embodiments, the conductive lines 114A and the landing pads 114B may be formed of the same material and formed by a similar method to that of the conductive vias 112. Therefore, its detailed description will be omitted herein.

Figure 1C:
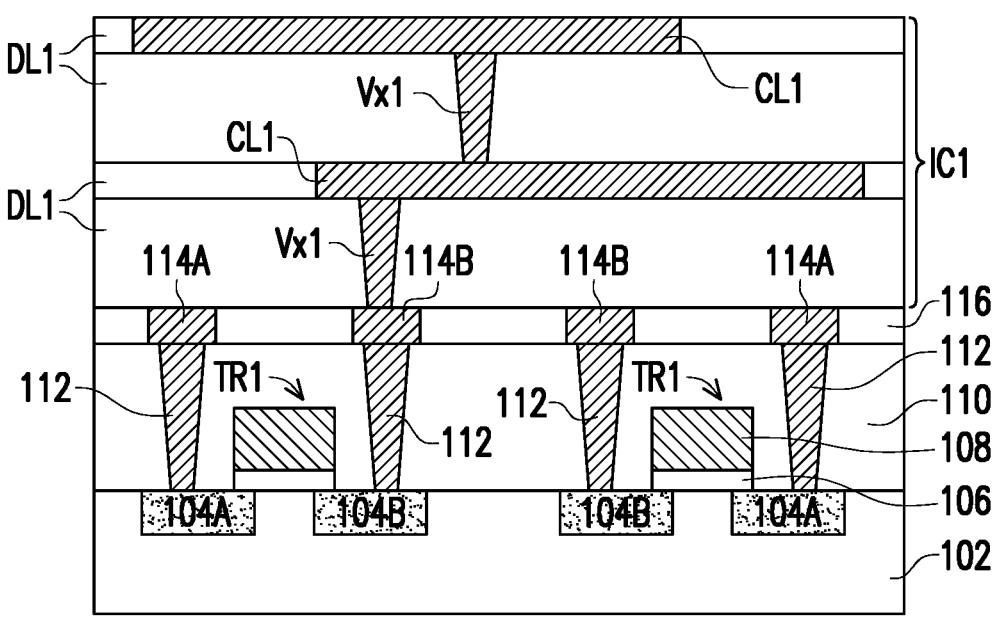

Referring to FIG. 1C, in a subsequent step, an interconnection structure IC1 is formed over the dielectric layer 116. The interconnection structure IC1 may be electrically connected to the conductive lines 114A and/or the landing pads 114B. In some embodiments, the interconnection structure IC1 is formed by forming a plurality of conductive vias Vx1, a plurality of conductive layers CL1 and a plurality of dielectric layers DL1 alternately stacked up along a build-up direction. In some embodiments, the conductive vias Vx1 and conductive layers CL1 are embedded in the dielectric layers DL1. In some embodiments, the conductive layers CL1 located at different level heights are connected to one another through the conductive vias Vx1. In other words, the conductive layers CL1 are electrically connected to one another through the conductive vias Vx1. In some embodiments, the bottommost conductive vias Vx1 are connected to the transistor TR1 through the conductive vias 112, the conductive lines 114A and/or the landing pads 114B. In the exemplary embodiment, although only two layers of conductive vias Vx1 and two layers of conductive layers CL1 are illustrated herein, it is noted that the disclosure is not limited thereto. In certain embodiments, the number of layers of conductive vias Vx1 and the number of layers of conductive layers CL1 may be more than two, and may be adjusted based on actual design requirements. Furthermore, the number of layers of the dielectric layers DL1 may be adjusted depending on the number of layers of the conductive vias Vx1 and conductive layers CL1.

In some embodiments, the conductive vias Vx1 and the conductive layers CL1 may include commonly used conductive materials, such as metals or metal alloys including one or more of Al, AlCu, Cu, Ti, TiN, W, and the like. The conductive vias Vx1 and the conductive layers CL1 may be formed by any suitable method, such as chemical vapor deposition (CVD), physical vapor deposition (PVD), or the like. Furthermore, the dielectric layers DL1 may be formed of any suitable dielectric materials, such as silicon oxide, silicon nitride, silicon oxynitride, a spin-on dielectric material, or a low-k dielectric material. For example, the low-k dielectric materials are generally dielectric materials having a dielectric constant lower than 3.9. The dielectric layers DL1 may be formed using any acceptable deposition process, such as spin coating, physical vapor deposition (PVD), chemical vapor deposition (CVD), the like, or a combination thereof.

Figure 1D:
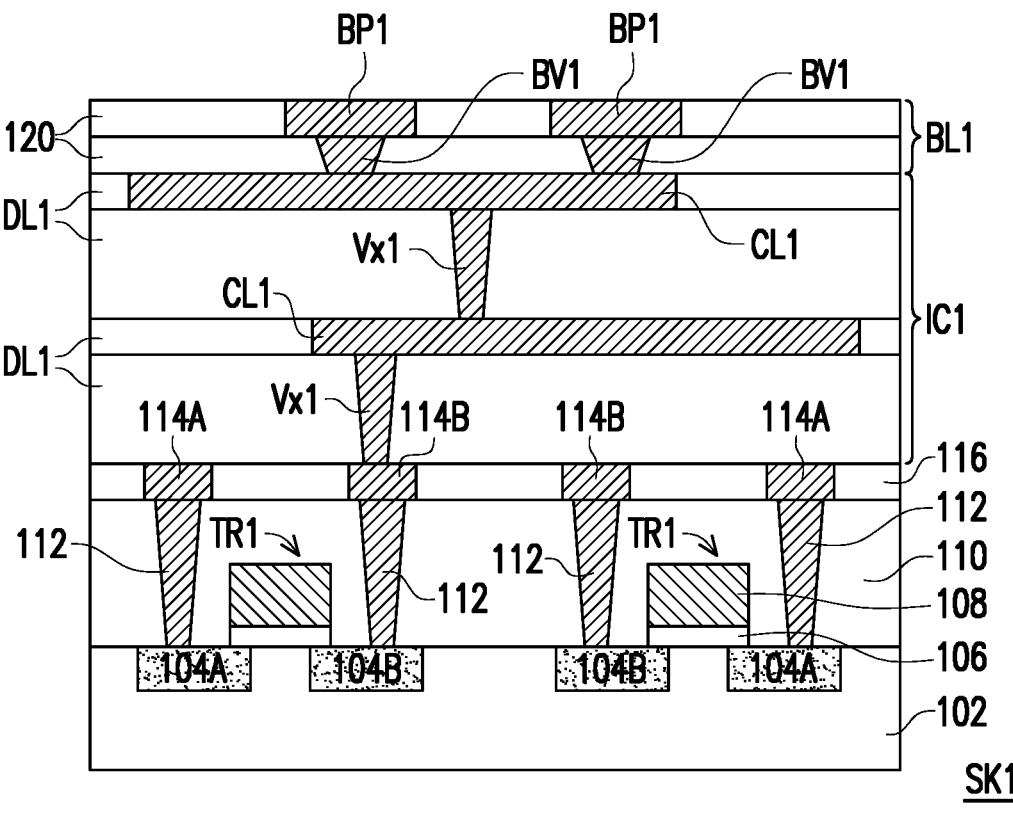

Referring to FIG. 1D, after forming the interconnection structure IC1, a bonding layer BL1 is formed over and electrically connected to the interconnection structure IC1. In some embodiments, forming the bonding layer BL1 includes forming a plurality of bonding vias BV1, a plurality of bonding pads BP1 and a plurality of dielectric layers 120. For example, the bonding vias BV1 are electrically connected to the topmost conductive layer CL1 of the interconnection structure IC1, the bonding pads BP1 are disposed on and electrically connected to the bonding vias BV1, while the dielectric layers 120 are surrounding the bonding vias BV1 and the bonding pads BP1. In the exemplary embodiment, although two sets of bonding vias BV1 and bonding pads BP1 are illustrated herein, it is noted that the disclosure is not limited thereto. In some alternative embodiments, the bonding layer BL1 may include one set of bonding via BV1 and bonding pad BP1, or include three sets or more of bonding vias BV1 and bonding pads BP1.

In the exemplary embodiment, a material of the bonding vias BV1 and the bonding pads BP1 may be similar to a material of the conductive vias Vx1 and the conductive layers CL1. Furthermore, a material of the dielectric layers 120 may be similar to a material of the dielectric layers DL1. Therefore, the details of the bonding vias BV1, the bonding pads BP1 and the dielectric layers 120 will be omitted herein. After forming the bonding layer BL1, a first stacked structure SK1 in accordance with some embodiments of the present disclosure is accomplished.

Figure 2A:
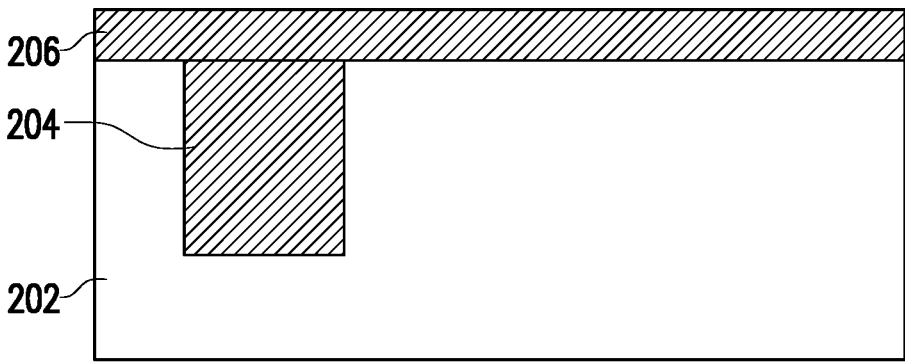
FIG. 2A to FIG. 2F are schematic sectional views of various stages in a method of fabricating a second stacked structure according to some exemplary embodiments of the present disclosure.

FIG. 2A to FIG. 2F are schematic sectional views of various stages in a method of fabricating a second stacked structure according to some exemplary embodiments of the present disclosure. Referring to FIG. 2A, a second substrate 202 is provided. The second substrate 202 may be a semiconductor substrate, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including silicon germanium (SiGe), GaAsP, AlInAs, AlGaAs, GaInAs, GaInP, and/or GaInAsP; or combinations thereof. Other substrates, such as multi-layered or gradient substrates, may also be used. In some embodiments, the second substrate 202 may include the same material as the first substrate 102. In some other embodiments, the second substrate 202 and the first substrate 102 are made of different materials.

In some embodiments, the second substrate 202 is patterned to form openings, and a through substrate via 204 is formed to fill the openings. The through substrate via 204 may be formed of conductive materials, and may be formed by any suitable processes (such as deposition, damascene, dual damascene, etc.) After forming the through substrate via 204, a conductive line 206 (e.g. a bit line) is formed over the second substrate 202 and electrically connected to the through substrate via 204. The conductive line 206 may include commonly used conductive materials, such as metals or metal alloys including one or more of Al, AlCu, Cu, Ti, TiN, W, and the like. The conductive line 206 may be formed by any suitable method, such as damascene, dual-damascene, plating, deposition, the like, or combinations thereof.

Figure 2B:
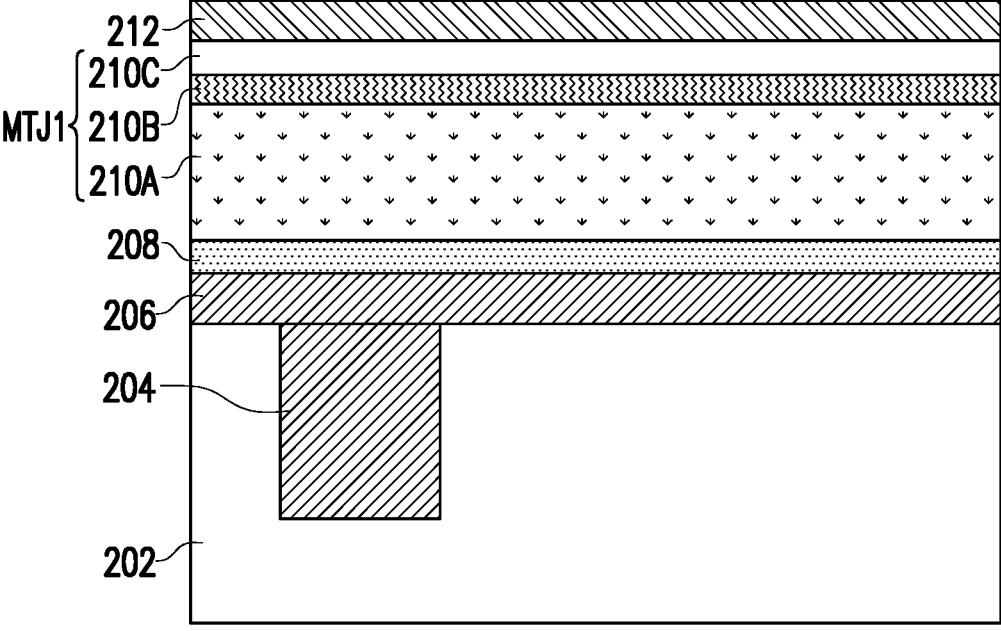

Referring to FIG. 2B, in a subsequent step, a seed layer 208 is formed on the second substrate 202 over the conductive line 206. The seed layer 208 may be formed through, for example, a sputtering process, a physical vapor deposition (PVD) process, or the like. In some embodiments, the seed layer 208 includes platinum (Pt), tantalum (Ta), nickel-chromium (NiCr), nickel (Ni), chromium (Cr), titanium-copper alloys, or other suitable materials. After forming the seed layer 208, a magnetic tunnel junction (MTJ) structure MTJ1 is formed over the seed layer 208. For example, forming the MTJ structure MTJ1 includes sequentially forming a synthetic antiferromagnet layer 210A (or pinned layer), a tunnel barrier layer 210B and a free layer 210C over the seed layer 208. The synthetic antiferromagnet layer 210A is disposed on and in physical contact with the seed layer 208, the tunnel barrier layer 210B is disposed on and in physical contact with the synthetic antiferromagnet layer 210A, and the free layer 210C is disposed on and in physical contact with the tunnel barrier layer 210B.

In the exemplary embodiment, the synthetic antiferromagnet layer 210A is grown on the seed layer 208 to ensure good growth of the multilayer films of the synthetic antiferromagnet layer 210A, and to produce strong pinned layers. In some embodiments, the synthetic antiferromagnet layer 210A and the free layer 210C include one or more ferromagnetic materials that can be magnetically oriented, respectively. For example, the synthetic antiferromagnet layer 210A and the free layer 210C may include ferromagnetic materials, which may be comprised of metal or metal alloy, such as Fe, Co, Ni, NiFe, CoFeB, FeB, CoFe, FePt, FePd, CoPt, CoPd, CoNi, TbFeCo, CrNi or the like.

In one embodiment, a magnetic orientation of the synthetic antiferromagnet layer 210A is static (i.e., fixed), while a magnetic orientation of the free layer 210C is capable of switching between a parallel configuration and an anti-parallel configuration with respect to that of the synthetic antiferromagnet layer 210A. The parallel configuration provides for a low resistance state that digitally stores data as a first data state (e.g., a logical "0"). The anti-parallel configuration provides for a high resistance state that digitally stores data as a second data state (e.g., a logical "1").

In some embodiments, the tunnel barrier layer 210B is made of a non-magnetic material and is disposed between the synthetic antiferromagnet layer 210A and the free layer 210C. In certain embodiments, the tunnel barrier layer 210B includes a relatively thin oxide layer capable of electrically isolating the free layer 210C from the synthetic antiferromagnet layer 210A at low potentials and capable of conducting current through electron tunneling at higher potentials. In one embodiment, the tunnel barrier layer 210B is made of magnesium oxide (MgO). In some embodiment, after forming the MTJ structure MTJ1, a capping layer 212 is formed over the free layer 210C of the MTJ structure MTJ1. The capping layer 212 may include non-ferromagnet metal such as silver (Ag), gold (Au), copper (Cu), tantalum (Ta), tantalum nitride (TaN), tungsten (W), manganese (Mn), platinum (Pt), palladium (Pd), vanadium (V), chromium (Cr), niobium (Nb), molybdenum (Mo), technetium (Tc), ruthenium (Ru), iridium (Ir), rhenium (Re), osmium (Os), aluminum oxide (Al$_2$O$_3$), magnesium oxide (MgO), tantalum oxide (TaO), ruthenium oxide (RuO) or a combination thereof. The capping layer 212 may reduce write current of its associated MRAM cell.

Figure 2C:
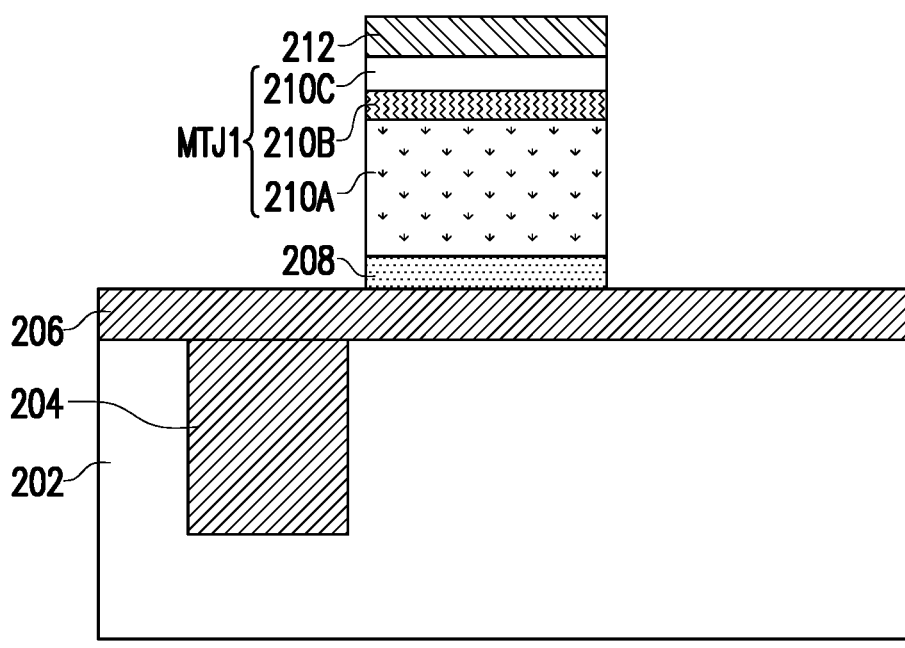

Referring to FIG. 2C, the seed layer 208, the MTJ structure MTJ1 and the capping layer 212 are selectively etched to form a plurality of MTJ structures MTJ1 over the conductive line 206 (only one MTJ structure illustrated). For example, the selective etching process includes a reactive ion etching (RIE) process, an ion beam etching (IBE) process, or combinations thereof. In some embodiments, after the selective etching process, sidewalls of the MTJ structure MTJ1 are aligned with sidewalls of the seed layer 208, and aligned with sidewalls of the capping layer 212.

Figure 2D:
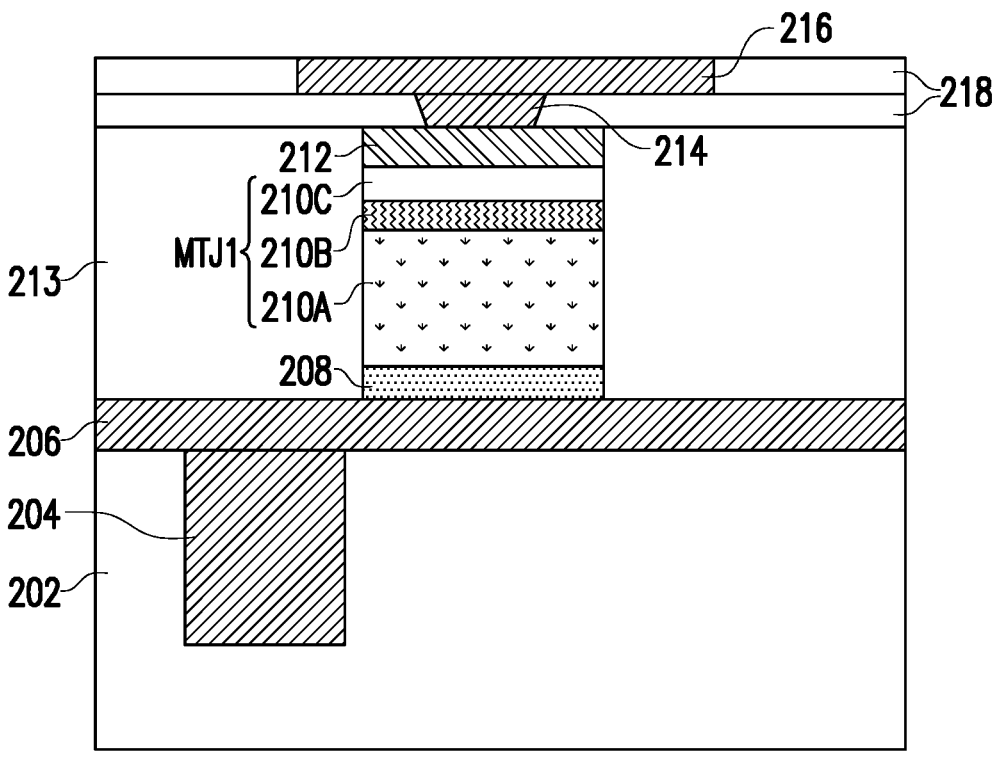

Referring to FIG. 2D, in a subsequent step, a dielectric layer 213 is formed on the second substrate 202 to surround the conductive line 206 and to surround the seed layer 208, the MTJ structure MTJ1 and the capping layer 212. In some embodiments, the dielectric layer 213 may be formed of any suitable dielectric material including, for example, a nitride such as silicon nitride, an oxide such as silicon oxide, SiOC, and SiOCN, SiCN, phosphosilicate glass (PSG), borosilicate glass (BSG), boron-doped phosphosilicate glass (BPSG), the like, or combinations thereof. The dielectric layer 213 may be formed using any acceptable deposition process, such as spin coating, physical vapor deposition (PVD), chemical vapor deposition (CVD), the like, or a combination thereof. In some embodiments, the dielectric layer 213 may be a low-k dielectric material, such as a dielectric material having a dielectric constant (k value) lower than about 3.0, for example.

In a subsequent step, a top electrode 214, a top conductive layer 216 and dielectric layers 218 are formed over the MTJ structure MTJ1. For example, the top electrode 214 is electrically connected to the MTJ structure MTJ1 through the capping layer 212. In the exemplary embodiment, the top electrode 214 and the top conductive layer 216 include metals or metal alloys such as one or more of Al, AlCu, Cu, Ti, TiN, W, or the like, and may be formed by electroplating, deposition or the like. Furthermore, the dielectric layers 218 may be formed of similar materials to the dielectric layer 213. Thus, the details of the dielectric layers 218 will be omitted herein.

Figure 2E:
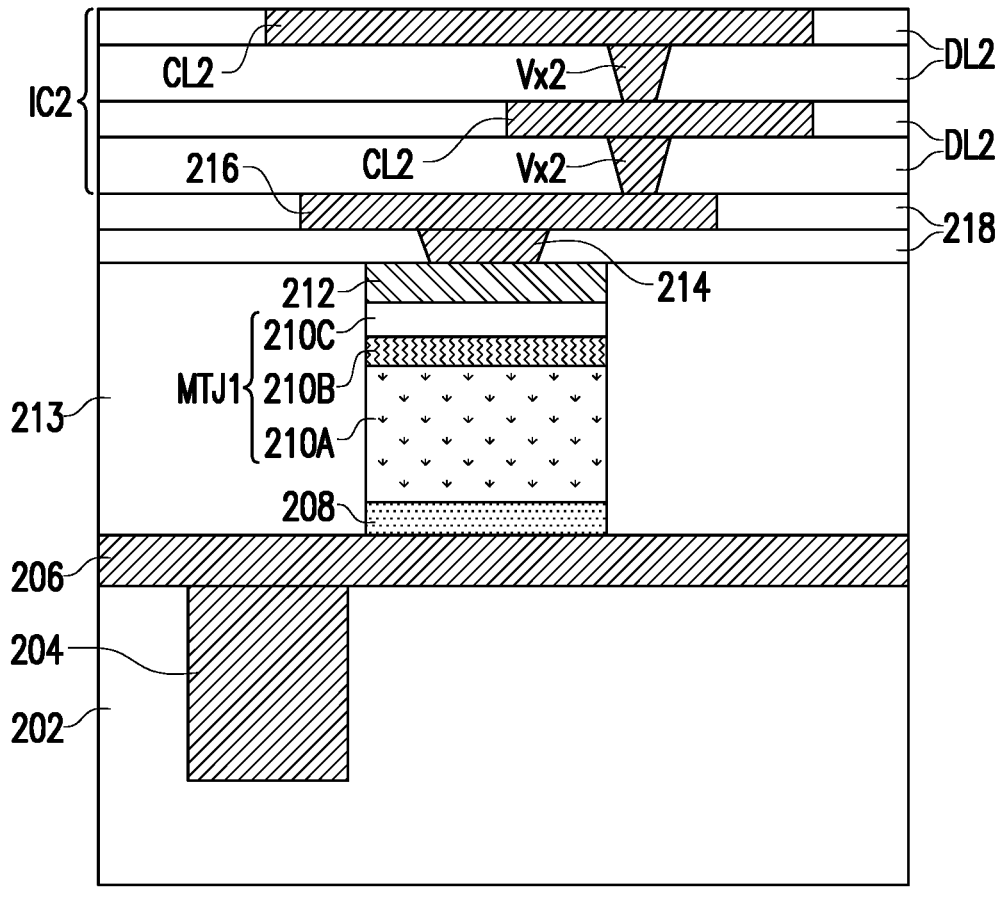

Referring to FIG. 2E, in some embodiments, a second interconnection structure IC2 is formed over the dielectric layers 218. The second interconnection structure IC2 may be electrically connected to the MTJ structure MTJ1 through the top electrode 214, the top conductive layer 216 and the capping layer 212. In some embodiments, the second interconnection structure IC2 is formed by forming a plurality of second conductive vias Vx2, a plurality of second conductive layers CL2 and a plurality of dielectric layers DL2 alternately stacked up along a build-up direction. In some embodiments, the second conductive vias Vx2 and second conductive layers CL2 are embedded in the dielectric layers DL2. In some embodiments, the second conductive layers CL2 located at different level heights are connected to one another through the second conductive vias Vx2. In other words, the second conductive layers CL2 are electrically connected to one another through the second conductive vias Vx2. In the exemplary embodiment, although only two layers of second conductive vias Vx2 and two layers of second conductive layers CL2 are illustrated herein, it is noted that the disclosure is not limited thereto. In certain embodiments, the number of layers of second conductive vias Vx2 and the number of layers of second conductive layers CL2 may be more than two, and may be adjusted based on actual design requirements. Furthermore, the number of layers of the dielectric layers DL2 may be adjusted depending on the number of layers of the second conductive vias Vx2 and second conductive layers CL2.

In some embodiments, the second conductive vias Vx2 and the second conductive layers CL2 may include commonly used conductive materials, such as metals or metal alloys including one or more of Al, AlCu, Cu, Ti, TiN, W, and the like. The second conductive vias Vx2 and the second conductive layers CL2 may be formed by any suitable method, such as chemical vapor deposition (CVD), physical vapor deposition (PVD), or the like. Furthermore, the dielectric layers DL2 may be formed of any suitable dielectric materials, such as silicon oxide, silicon nitride, silicon oxynitride, a spin-on dielectric material, or a low-k dielectric material. For example, the low-k dielectric materials are generally dielectric materials having a dielectric constant lower than 3.9. The dielectric layers DL2 may be formed using any acceptable deposition process, such as spin coating, physical vapor deposition (PVD), chemical vapor deposition (CVD), the like, or a combination thereof.

Figure 2F:
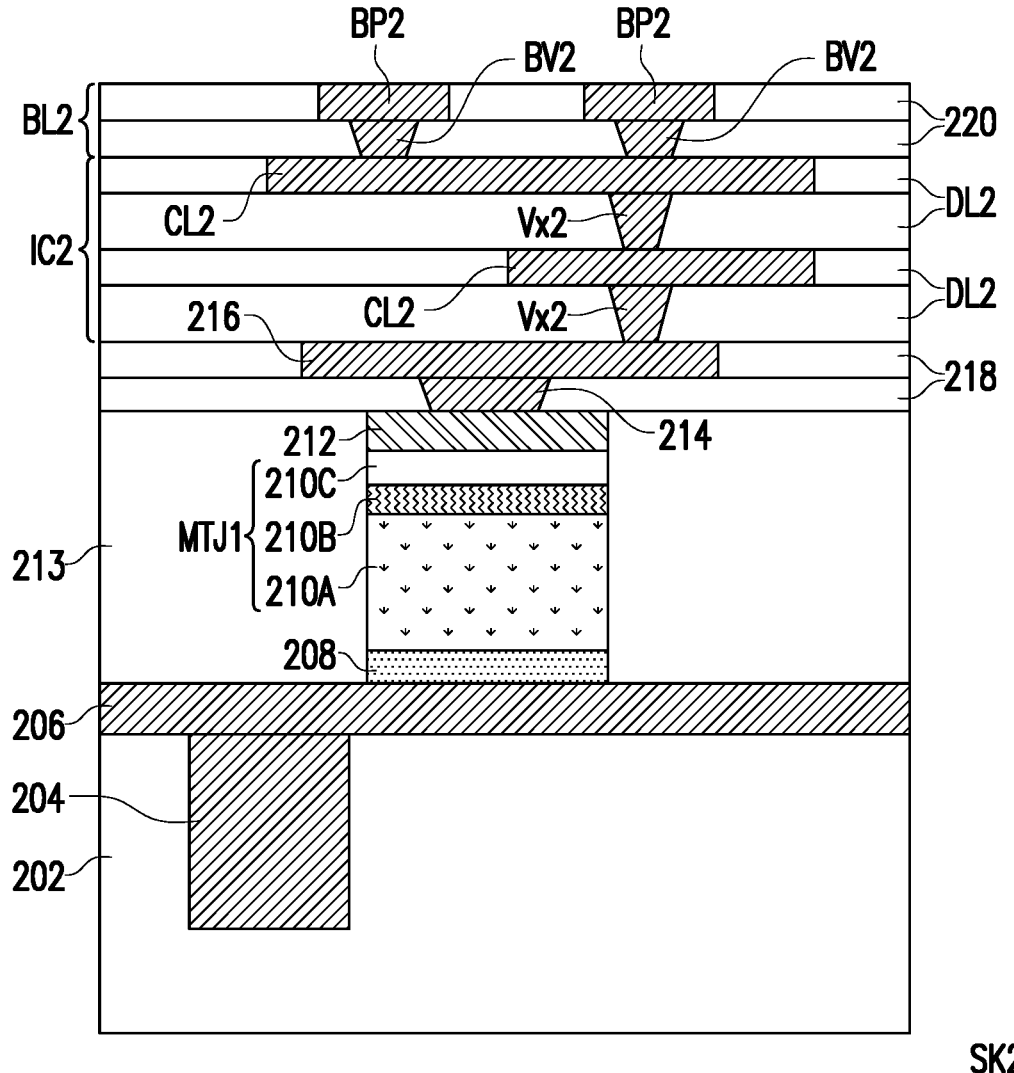

Referring to FIG. 2F, after forming the second interconnection structure IC2, a second bonding layer BL2 is formed over and electrically connected to the second interconnection structure IC2. In some embodiments, forming the second bonding layer BL2 includes forming a plurality of second bonding vias BV2, a plurality of second bonding pads BP2 and a plurality of dielectric layers 220. For example, the second bonding vias BV2 are electrically connected to the topmost second conductive layer CL2 of the second interconnection structure IC2, the second bonding pads BP2 are disposed on and electrically connected to the second bonding vias BV2, while the dielectric layers 220 are surrounding the second bonding vias BV2 and the second bonding pads BP2. In the exemplary embodiment, although two sets of second bonding vias BV2 and second bonding pads BP2 are illustrated herein, it is noted that the disclosure is not limited thereto. In some alternative embodiments, the second bonding layer BL2 may include one set of second bonding via BV2 and second bonding pad BP2, or include three sets or more of second bonding vias BV2 and second bonding pads BP2. In the exemplary embodiment, the number of second bonding vias BV2 and second bonding pads BP2 in the second bonding layer BL2 will correspond to the number of bonding vias BV1 and bonding pads BP1 in the bonding layer BL1 of the first stacked structure SK1.

In the exemplary embodiment, a material of the second bonding vias BV2 and the second bonding pads BP2 may be similar to a material of the second conductive vias Vx2 and the second conductive layers CL2. Furthermore, a material of the dielectric layers 220 may be similar to a material of the dielectric layers DL2. Therefore, the details of the second bonding vias BV2, the second bonding pads BP2 and the dielectric layers 220 will be omitted herein. After forming the second bonding layer BL2, a second stacked structure SK2 in accordance with some embodiments of the present disclosure is accomplished.

Figure 3A:
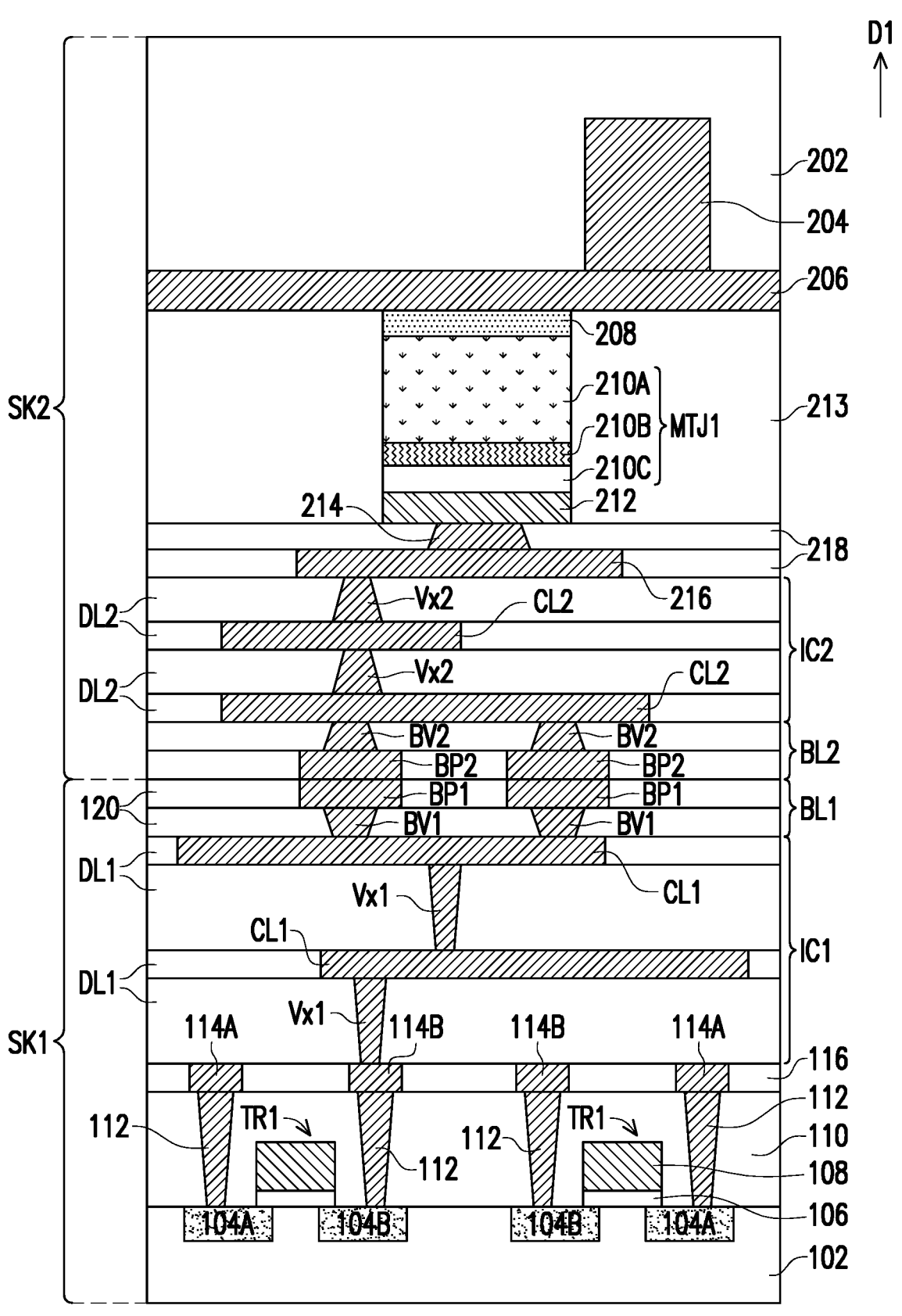
FIG. 3A to FIG. 3C are schematic sectional views of various stages in a method of fabricating a semiconductor device according to some exemplary embodiments of the present disclosure.
Figure 3B:
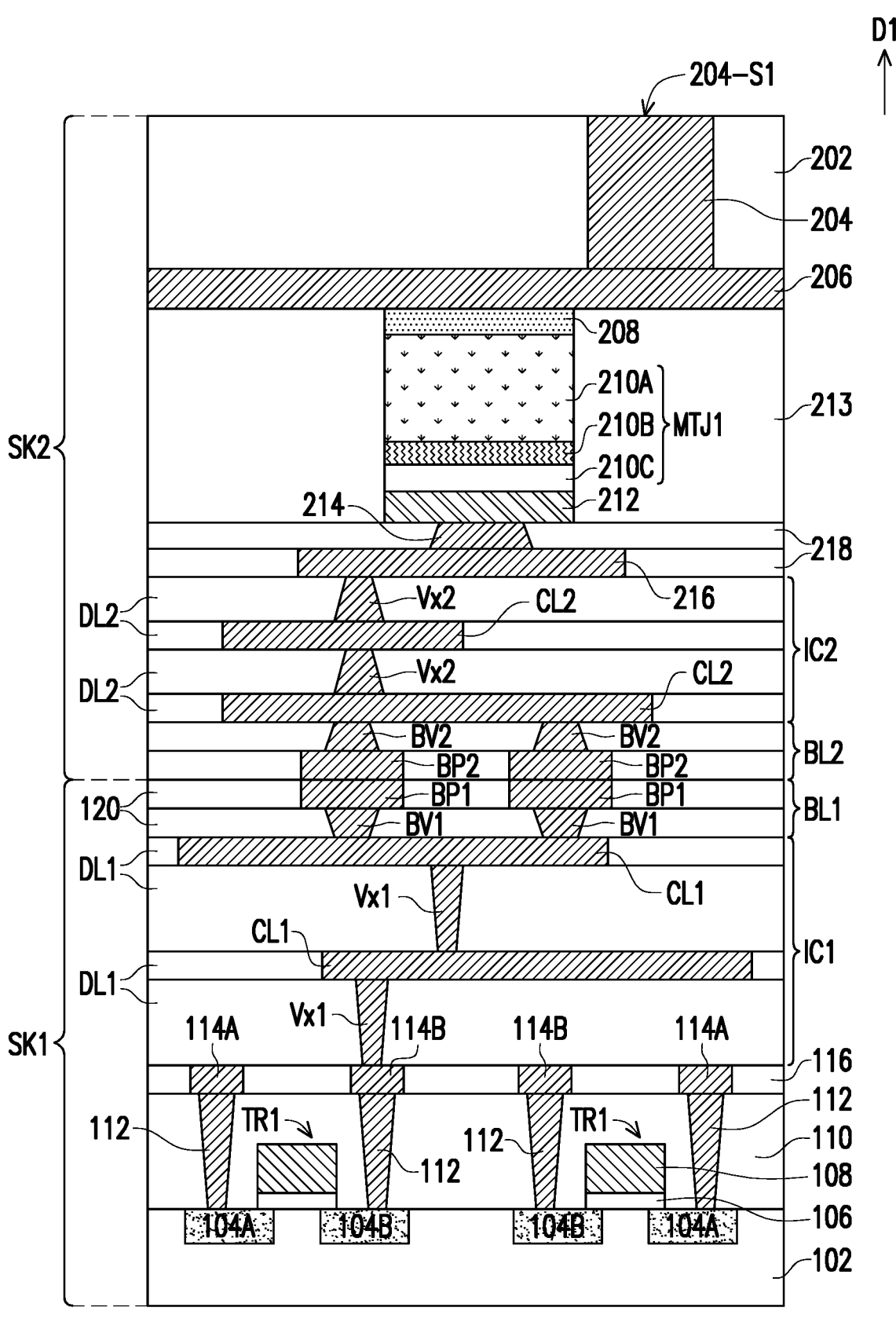
Figure 3C:
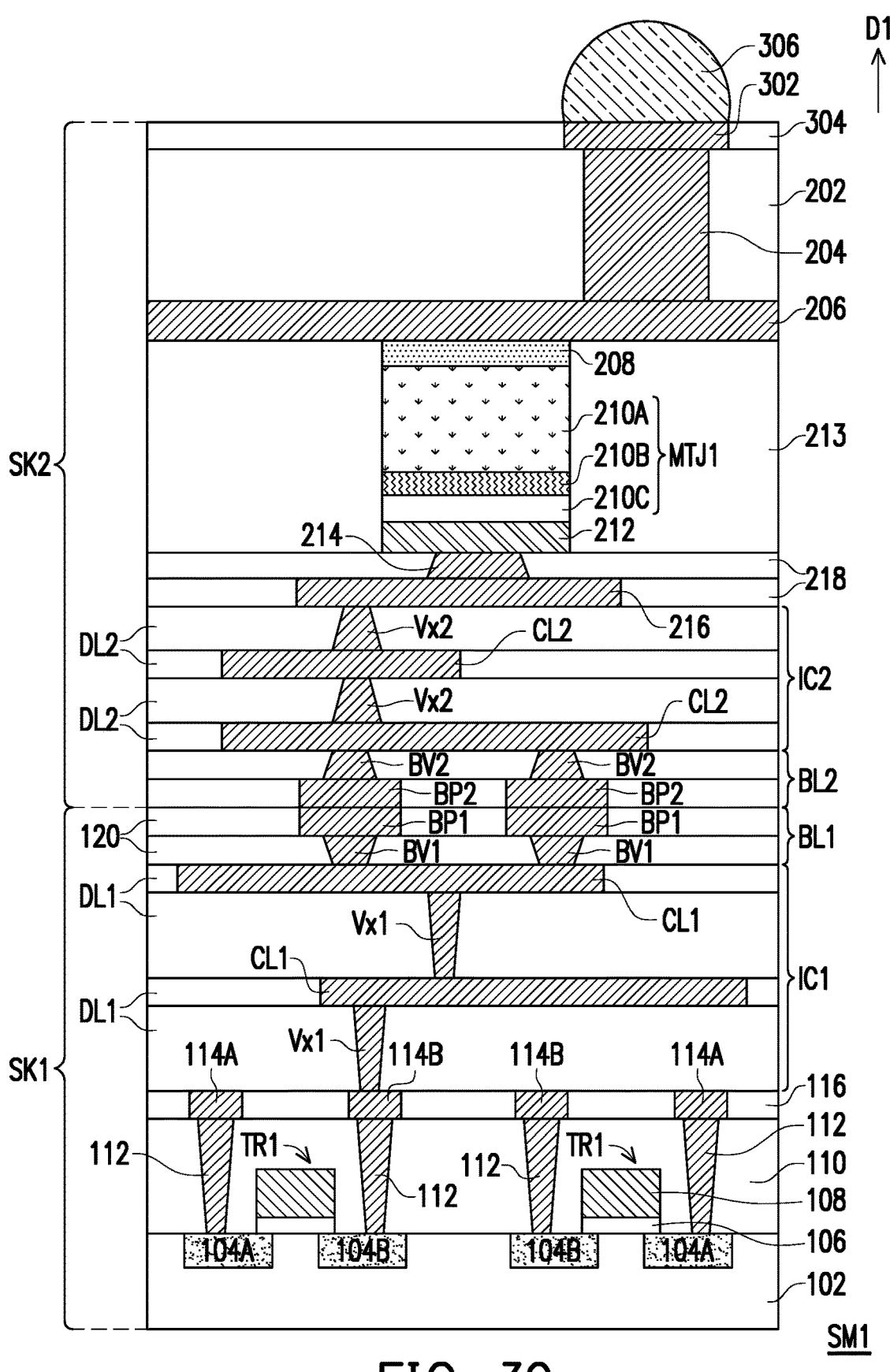

FIG. 3A to FIG. 3C are schematic sectional views of various stages in a method of fabricating a semiconductor device according to some exemplary embodiments of the present disclosure. Referring to FIG. 3A, in some embodiments, the second stacked structure SK2 illustrated in FIG. 2F is disposed on the first stacked structure SK1 illustrated in FIG. 1D. For example, the second stacked structure SK2 is bonded to the first stacked structure SK1 by directly joining the bonding layer BL1 to the second bonding layer BL2 in a face-to-face manner. In certain embodiments, the bonding pads BP1 of the first stacked structure SK1 are directly bonded to the second bonding pads BP2 of the second stacked structure SK2 through hybrid bonding.

After bonding the second stacked structure SK2 to the first stacked structure SK1, it is noted that the bonding layer BL1, the second bonding layer BL2 and the second inter-connection structure IC2 are sequentially stacked up over the interconnection structure IC1 along a first direction D1. For example, the conductive vias Vx1 and the bonding vias BV1 may have via widths that increases along the first direction D1, while the second conductive vias Vx2 and the second bonding vias BV2 may have via widths that decreases along the first direction D1. In some embodi-ments, the MTJ structure MTJ1 is stacked over the second bonding layer BL2 and over the second interconnection structure IC2 along the first direction D1. In certain embodi-ments, the free layer 210C, the tunnel barrier layer 210B, the synthetic antiferromagnet layer 210C of the MTJ structure MTJ1 are sequentially stacked up over the capping layer 212 along the first direction D1. Furthermore, the seed layer 208 is stacked on top of the MTJ structure MTJ1, while the conductive line 206 and the through substrate via 204 are stacked over the seed layer 208 along the first direction D1.

Referring to FIG. 3B, in a subsequent step, the second substrate 202 is thinned down to reveal the through substrate via 204. For example, the second substrate 202 is thinned by a planarization process such as a chemical mechanical polishing (CMP) process or a grinding process to remove portions of the second substrate 202. After the planarization process, a surface 204-S1 of the through substrate via 204 is aligned with a surface of the second substrate 202.

Referring to FIG. 3C, after revealing the surface 204-S1 of the through substrate via 204, a contact pad 302 is formed on and electrically connected to the through substrate via 204, while a dielectric layer 304 is formed to surround the contact pad 302. In some embodiments, the contact pad 302 include under bump metallurgies (UBMs). After forming the contact pad 302, a conductive bump 306 is formed on and electrically connected to the contact pad 302. In some embodiments, the conductive bump 306 is a solder bump, lead-free solder bump, or micro-bump, such as controlled collapse chip connection (C4) bump or micro-bump con-taining copper pillars. After forming the conductive bump 306 on the contact pad 302, a semiconductor device SM1 in accordance with some embodiments of the present disclo-sure is accomplished.

In the semiconductor device SM1, the access transistor (transistor TR1) and the MTJ structure MTJ1 are con-structed on separate substrates. For example, the transistor TR1 is formed as part of a first stacked structure SK1, while the MTJ structure MTJ1 is formed as part of a second stacked structure SK2. As such, during the formation of the MTJ structure MTJ1, the MTJ films can be deposited in the same order as conventional bottom pinned structure using a seed layer 208 on the bottom to produce a strong synthetic antiferromagnet layer 210A. In addition, after bonding the second stacked structure SK2 to the first stacked structure SK1 in a face-to-face manner, the MTJ structure MTJ1 will have a top pinned configuration. In other words, the layers in the MTJ structure MTJ1 are flipped so that the tunnel barrier layer 210B is located below the synthetic antiferro-magnet layer 210A, while the free layer 210C is located below the tunnel barrier layer 210B. With such configura-tion, the asymmetry of MTJ switching of the MTJ structure MTJ1 matches the write current asymmetry of the access transistor (the transistor TR1), thus enabling higher device densities. Overall, the advantages of a top pinned stack can be realized without sacrificing performance of the synthetic antiferromagnet layer 210A, and compared with bottom pinned MTJ structures, the size of the transistor TR1 can be shrunk leading to increased density of the MRAM array.

Figure 4A:
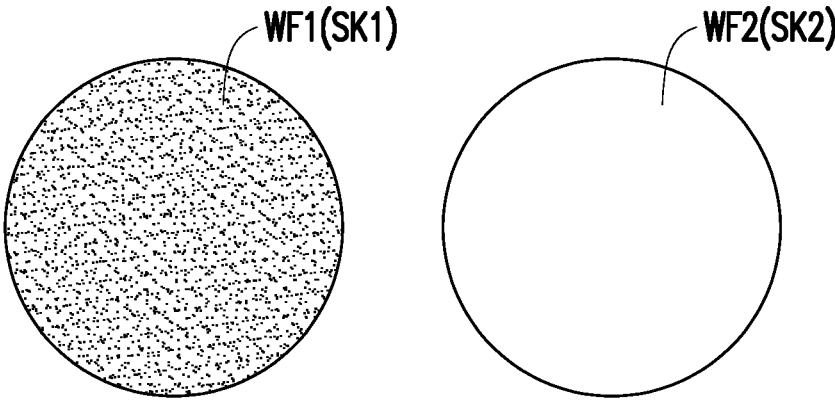
FIG. 4A and FIG. 4B are top views of the first stacked structure and the second stacked structure according to some exemplary embodiments of the present disclosure.
Figure 4B:
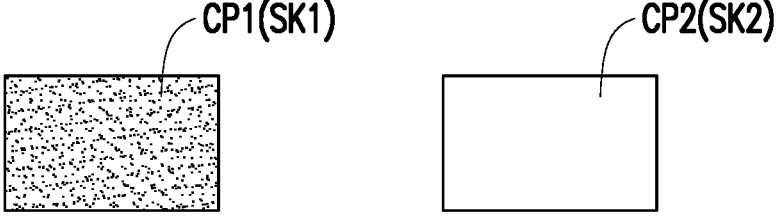

FIG. 4A and FIG. 4B are top views of the first stacked structure and the second stacked structure according to some exemplary embodiments of the present disclosure. Referring to FIG. 4A, in some embodiments, the first stacked structure SK1 illustrated in FIG. 1D is part of a semiconductor wafer WF1, and the second stacked structure SK2 illustrated in FIG. 2F is part of another semiconductor wafer WF2. As such, when bonding the second stacked structure SK2 to the first stacked structure SK1, the sizes of the semiconductor wafer WF1, WF2 are matched, and sidewalls of the second stacked structure SK2 may be aligned with sidewalls of the first stacked structure SK1 (similar to that shown in FIG. 3A to FIG. 3C).

Referring to FIG. 4B, in another embodiment, the first stacked structure SK1 illustrated in FIG. 1D is part of a semiconductor chip CP1 diced from a wafer, while the second stacked structure SK2 illustrated in FIG. 2F is part of another semiconductor chip CP2 diced from another wafer. The sizes of the semiconductor chips CP1, CP2 may be the same or different. For example, if the size of the semicon-ductor chip CP1 matches the size of the semiconductor chip CP2, then when bonding the second stacked structure SK2 to the first stacked structure SK1, sidewalls of the second stacked structure SK2 may be aligned with sidewalls of the first stacked structure SK1 (similar to that shown in FIG. 3A to FIG. 3C). In some alternative embodiments, the size of the semiconductor chip CP2 is smaller than the size of the semiconductor chip CP1. As such, when bonding the second stacked structure SK2 to the first stacked structure SK1, sidewalls of the second stacked structure SK2 may be misaligned with sidewalls of the first stacked structure SK1.

Figure 5:
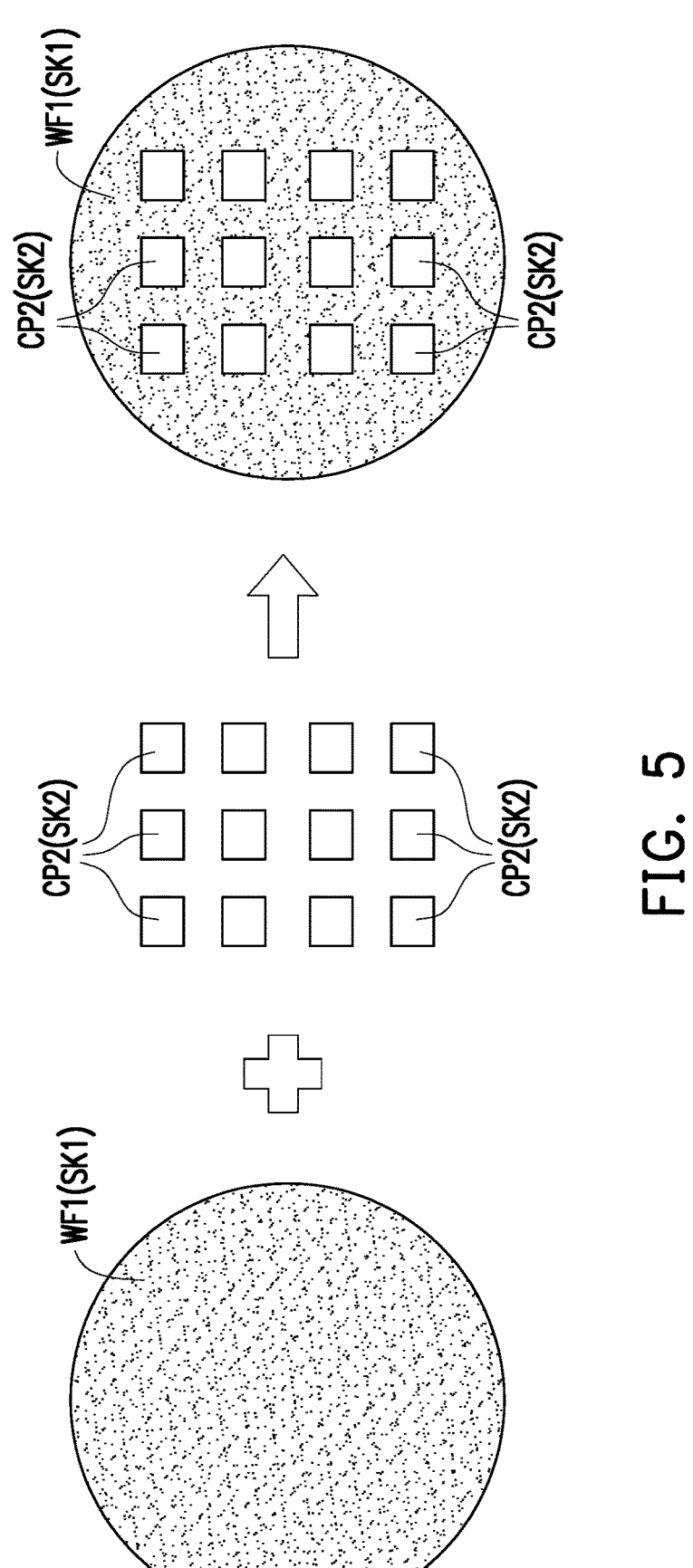
FIG. 5 illustrate top views of a method of bonding the second stacked structure to the first stacked structure according to some exemplary embodiments of the present disclosure.

FIG. 5 illustrate top views of a method of bonding the second stacked structure to the first stacked structure accord-ing to some exemplary embodiments of the present disclo-sure. As illustrated in FIG. 5, the first stacked structure SK1 illustrated in FIG. 1D is part of a semiconductor wafer WF1, while the second stacked structure SK2 illustrated in FIG. 2F is part of a semiconductor chip CP2 diced from another wafer. In the exemplary embodiment, a plurality of the semiconductor chips CP2 is bonded onto the semiconductor wafer WF1. In other words, a plurality of second stacked structures SK2 is bonded to one first stacked structure SK1. As illustrated in FIG. 5, when bonding the semiconductor chips CP2 (second stacked structures SK2) onto the semi-conductor wafer WF1 (first stacked structure SK1), the semiconductor chips CP2 are located on the semiconductor wafer WF1 and spaced apart from one another. In some embodiments, after bonding the semiconductor chips CP2 (second stacked structures SK2) onto the semiconductor wafer WF1 (first stacked structure SK1), an insulating encapsulant (not shown) may be formed on the first stacked structure SK1 to encapsulate and protect the second stacked structures SK2. Details of bonding multiple semiconductor chips CP2 to the semiconductor wafer WF1 will be further described with reference to FIG. 6A to FIG. 6C.

Figure 6A:
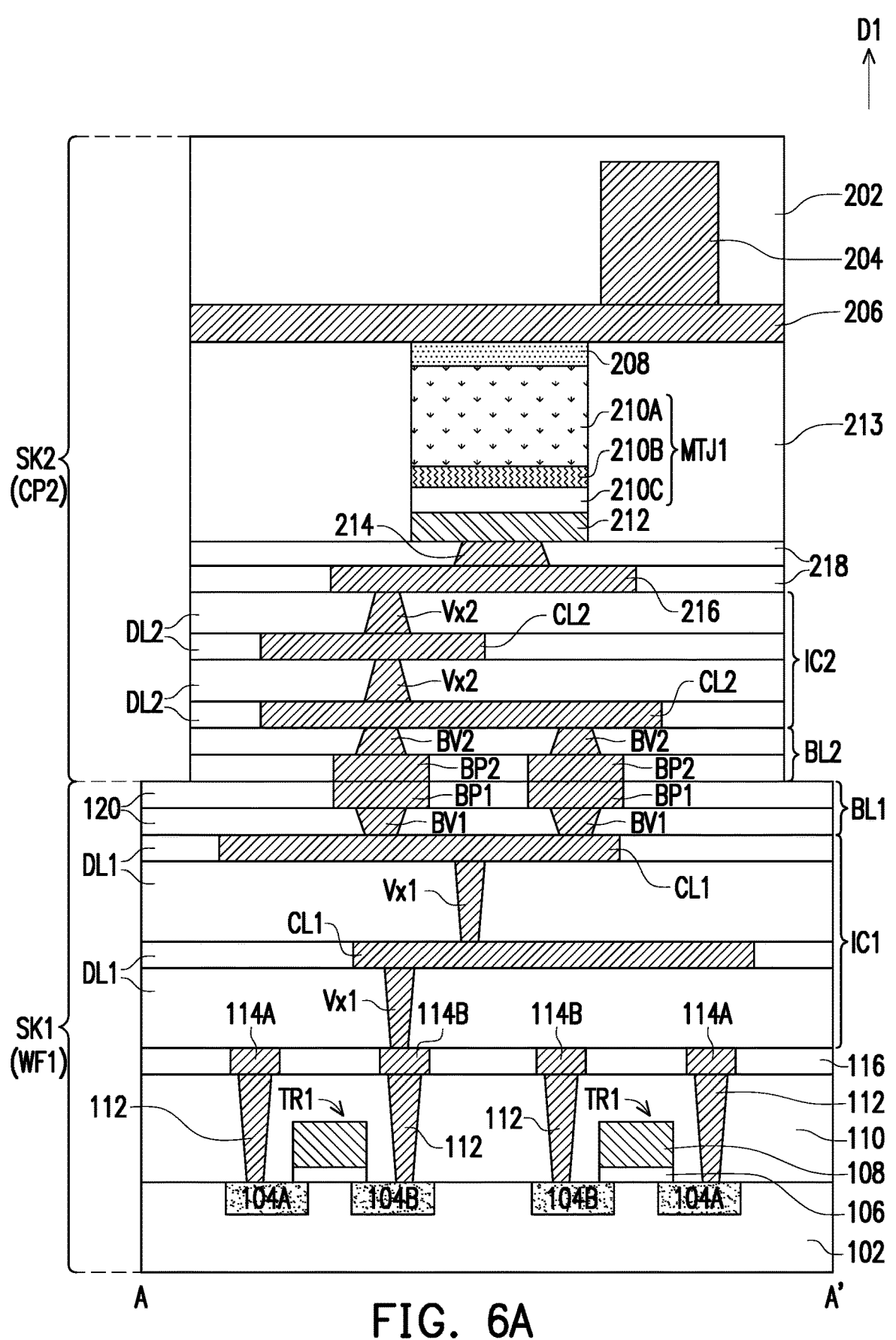
FIG. 6A to FIG. 6C are schematic sectional views of various stages in a method of fabricating a semiconductor device according to some other exemplary embodiments of the present disclosure.
Figure 6B:
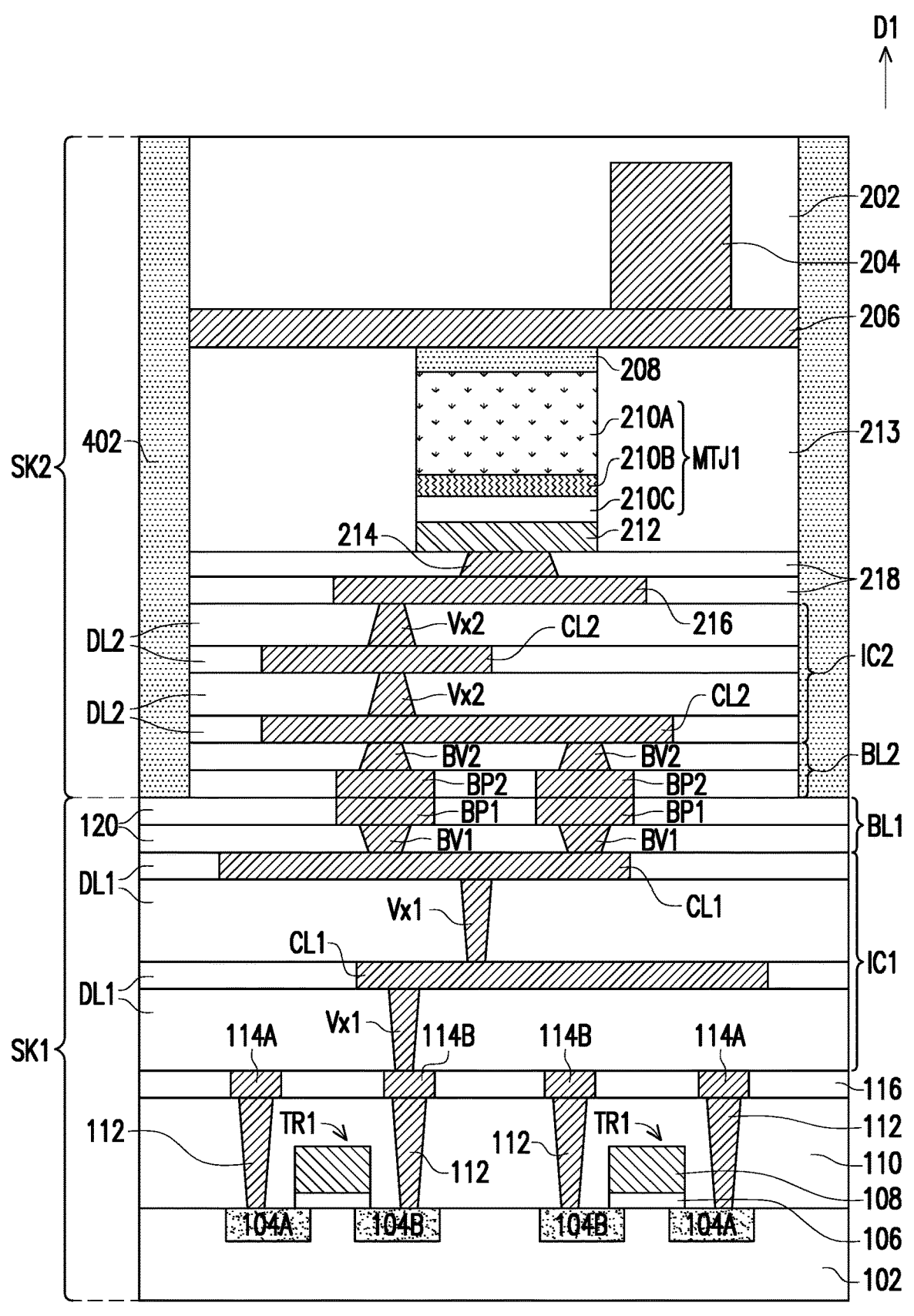
Figure 6C:
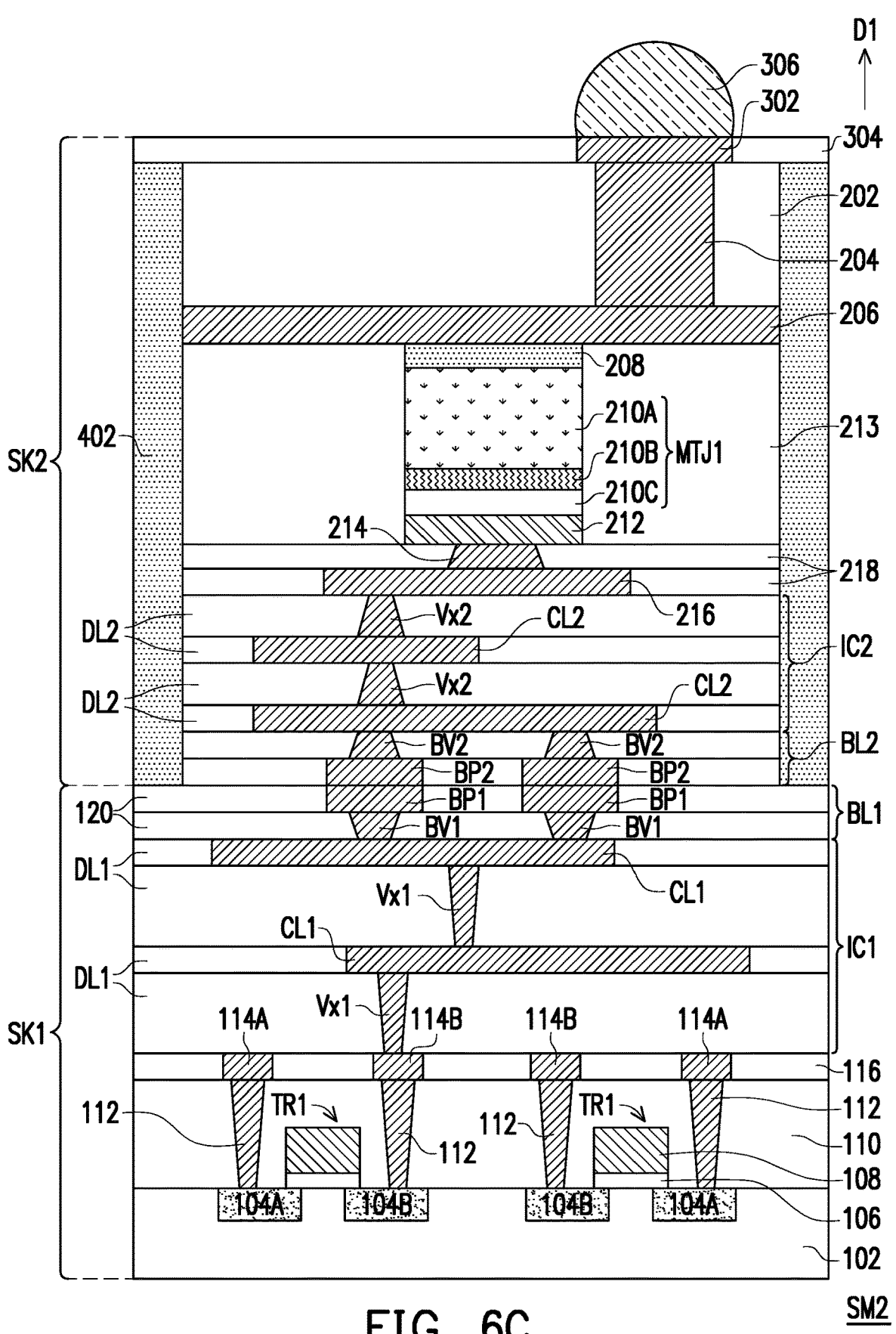

FIG. 6A to FIG. 6C are schematic sectional views of various stages in a method of fabricating a semiconductor device according to some other exemplary embodiments of the present disclosure. FIG. 6A illustrates a sectional view taken along line A-A' of the device shown in FIG. 5, where multiple semiconductor chips CP2 (second stacked struc-tures SK2) are bonded onto the semiconductor wafer WF1 (first stacked structure SK1). The method illustrated herein is similar to the method described in FIG. 3A to FIG. 3C.

Thus, the same reference numerals are used to refer to the same or liked parts, and its detailed description will be omitted herein. The difference between the methods is that the sidewalls of the second stacked structures SK2 are misaligned with the sidewalls of the first stacked structure SK1. As illustrated in FIG. 6A, and from the top view in FIG. 5, it is noted that the sidewalls of the second stacked structures SK2 do not extend beyond sidewalls of the first stacked structure SK1 (the semiconductor wafer WF1).

Referring to FIG. 6B, after bonding the semiconductor chips CP2 (second stacked structures SK2) onto the semiconductor wafer WF1 (first stacked structure SK1), an insulating encapsulant 402 is formed on the first stacked structure SK1 to surround the plurality of second stacked structures SK2. For example, the insulating encapsulant 402 is disposed on the dielectric layers 120 and on the dielectric layers DL1 of the first stacked structure SK1, and formed to surround and encapsulate the dielectric layer 213, the dielectric layers 220, the dielectric layers DL2 and the second substrate 202. In some embodiments, the insulating encapsulant 402 is formed through, for example, a compression molding process or transfer molding. In one embodiment, a curing process is performed to cure the insulating encapsulant 402.

In some embodiments, a material of the insulating encapsulant 402 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating encapsulant 402 may include an acceptable insulating encapsulation material. In some embodiments, the insulating encapsulant 114 may further include inorganic filler or inorganic compound (e.g. silica, clay, and so on) which can be added therein to optimize coefficient of thermal expansion (CTE) of the insulating encapsulant 402. The disclosure is not limited thereto.

Referring to FIG. 6C, after forming the insulating encapsulant 402, the second substrates 202 of each of the second stacked structures SK2 are thinned down to reveal the through substrate vias 204. For example, the second substrates 202 of multiple semiconductor chips CP2 are thinned by a planarization process such as a chemical mechanical polishing (CMP) process or a grinding process to remove portions of the second substrate 202. In certain embodiments, the insulating encapsulant 402 is also thinned down by the planarization process. After the planarization process, a surface 204-S1 of the through substrate via 204 is aligned with a surface of the second substrate 202, and aligned with a surface of the insulating encapsulant 402.

In a subsequent step, after revealing the surface 204-S1 of the through substrate via 204, a contact pad 302 is formed on and electrically connected to the through substrate via 204, while a dielectric layer 304 is formed to surround the contact pad 302. In some embodiments, the contact pad 302 include under bump metallurgies (UBMs). After forming the contact pad 302, a conductive bump 306 is formed on and electrically connected to the contact pad 302. In some embodiments, the conductive bump 306 is a solder bump, lead-free solder bump, or micro-bump, such as controlled collapse chip connection (C4) bump or micro-bump containing copper pillars. After forming the conductive bump 306 on the contact pad 302, a semiconductor device SM2 in accordance with some embodiments of the present disclosure is accomplished.

In the semiconductor device SM2, the access transistor (transistor TR1) and the MTJ structure MTJ1 are constructed on separate substrates. For example, the transistor TR1 is formed as part of a first stacked structure SK1 on the semiconductor wafer WF1, while the MTJ structure MTJ1 is formed as part of a second stacked structure SK2 on a semiconductor chip CP2. As such, during the formation of the MTJ structure MTJ1, the MTJ films can be deposited in the same order as conventional bottom pinned structure using a seed layer 208 on the bottom to produce a strong synthetic antiferromagnet layer 210A. In addition, after bonding the second stacked structure SK2 to the first stacked structure SK1 in a face-to-face manner, the MTJ structure MTJ1 will have a top pinned configuration. In other words, the layers in the MTJ structure MTJ1 are flipped so that the tunnel barrier layer 210B is located below the synthetic antiferromagnet layer 210A, while the free layer 210C is located below the tunnel barrier layer 210B. With such configuration, the asymmetry of MTJ switching of the MTJ structure MTJ1 matches the write current asymmetry of the access transistor (the transistor TR1), thus enabling higher device densities. Overall, the advantages of a top pinned stack can be realized without sacrificing performance of the synthetic antiferromagnet layer 210A, and compared with bottom pinned MTJ structures, the size of the transistor TR1 can be shrunk leading to increased density of the MRAM array.

Figure 7:
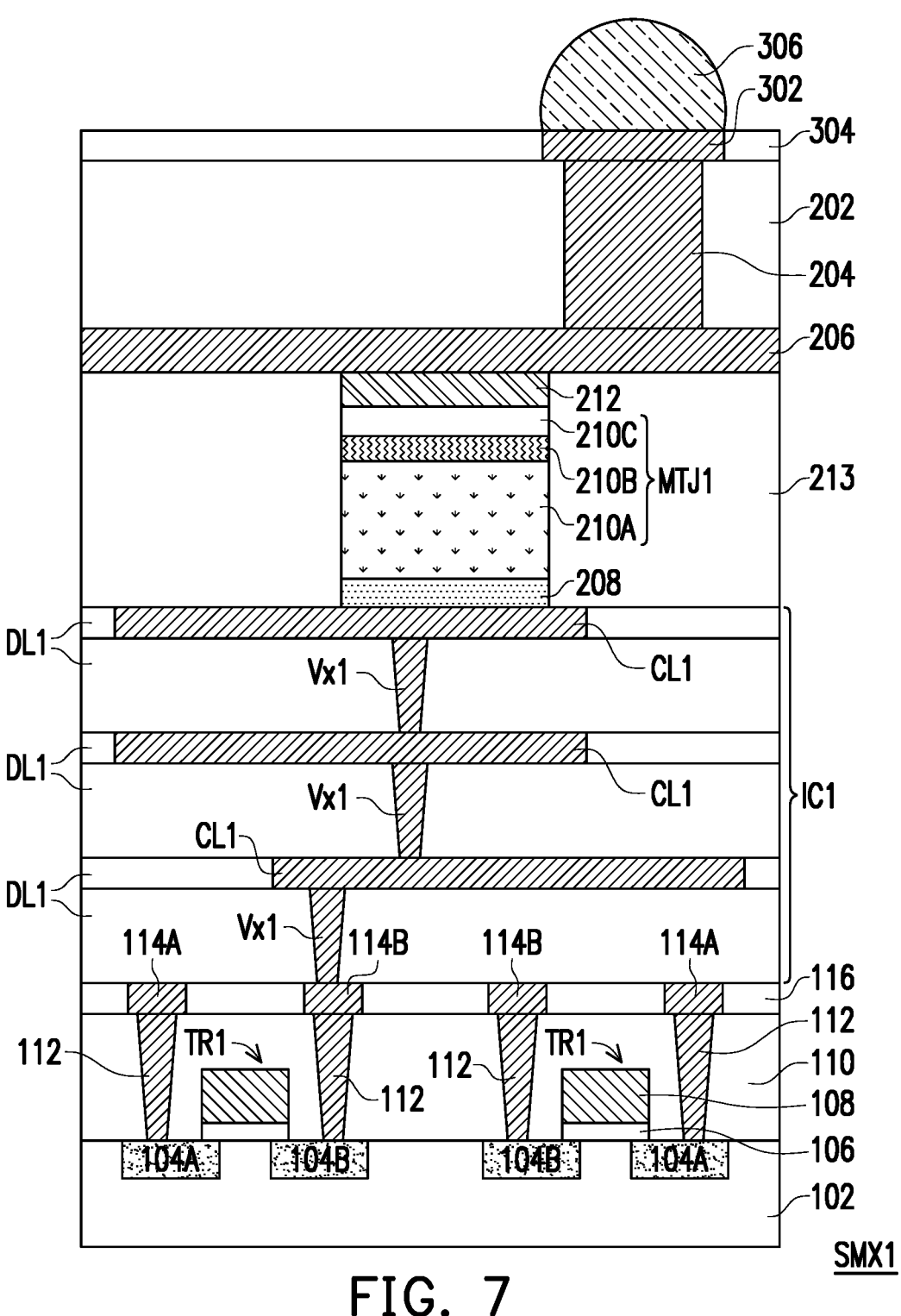
FIG. 7 is a schematic section view of a semiconductor device according to some comparative embodiments of the present disclosure.

FIG. 7 is a schematic section view of a semiconductor device according to some comparative embodiments of the present disclosure. The semiconductor device SMX1 illustrated in FIG. 7 is similar to the semiconductor devices SM1, SM2 illustrated in FIG. 3C and FIG. 6C. Therefore, the same reference numerals are used to refer to the same or liked parts, and its detailed description will be omitted herein. In the comparative embodiment, the MTJ structure MTJ1 is formed directly on top of the interconnection structure IC1 in a bottom pinned fashion. In other words, the synthetic antiferromagnet layer 210A is directly formed on the seed layer 208, the tunnel barrier layer 210B is directly formed on the synthetic antiferromagnet layer 210A, while the free layer 210C is directly formed on the tunnel barrier layer 210B.

In the above configuration, the parallel to antiparallel switching current of the MTJ structure MTJ1 is larger than the antiparallel to parallel current due to the weak reflected spin polarization of parallel to antiparallel switching. This asymmetry is opposite to the write current asymmetry of the access transistor TR1. Thus, in such embodiment, to compensate for the different asymmetries, the write transistor drive current must be increased, resulting in a larger transistor area and a reduction in device density.

Figure 8:
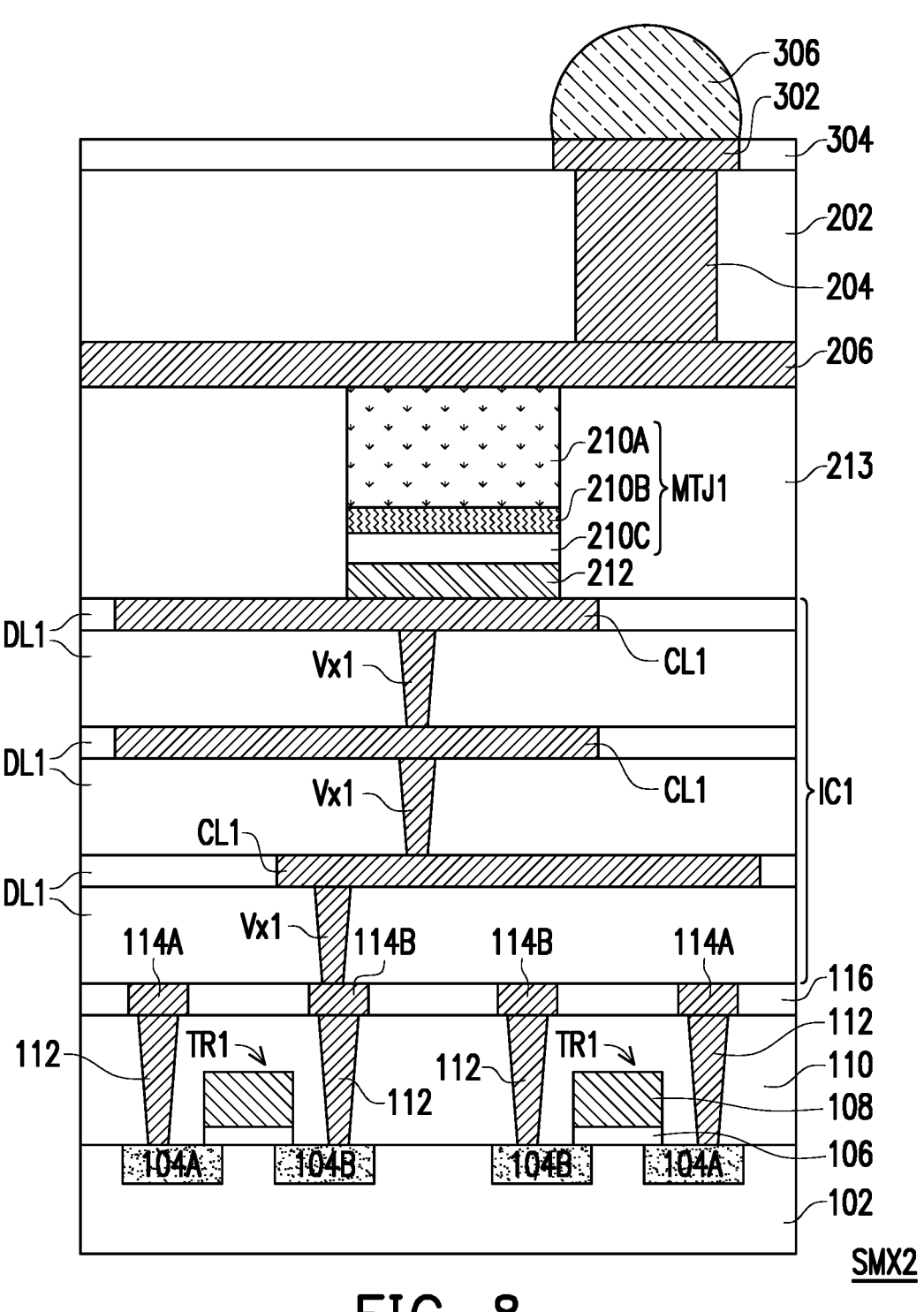
FIG. 8 is a schematic section view of a semiconductor device according to some other comparative embodiments of the present disclosure.

FIG. 8 is a schematic section view of a semiconductor device according to some other comparative embodiments of the present disclosure. The semiconductor device SMX1 illustrated in FIG. 8 is similar to the semiconductor devices SM1, SM2 illustrated in FIG. 3C and FIG. 6C. Therefore, the same reference numerals are used to refer to the same or liked parts, and its detailed description will be omitted herein. In the comparative embodiment, the MTJ structure MTJ1 is formed directly on top of the interconnection structure IC1 in a top pinned fashion. In other words, the free layer 210C is directly formed on the capping layer 212, the tunnel barrier layer 210B is directly formed on the free layer 210C, while the synthetic antiferromagnet layer 210A is directly formed on the tunnel barrier layer 210B.

In the above configuration, the asymmetry of switching of the MTJ structure MTJ1 matches the asymmetry of the access transistor TR1, enabling higher device densities. However, as a material of the tunnel barrier layer 210B is not favorable as a seed, a strong synthetic antiferromagnet layer 210A cannot be appropriately formed on the tunnel barrier layer 210B. It is noted that the synthetic antiferromagnet layer 210A needs a particular seed layer (for example Pt, Ta, NiCr, Ni Cr) to generate good growth of the multilayer films to produce strong pinned layers. In such comparative embodiment, the free layer 210C and tunnel barrier 210B do not provide a strong enough seeding effect to generate a strong synthetic antiferromagnet layer 210A. As such, the weak synthetic antiferromagnet layer 210A does not act as a strong pinned layer resulting in back-hopping, weak reflected spin polarization, and random weak bits within the array.

In the above-mentioned embodiments, the semiconductor device includes a transistor formed as part of a first stacked structure, and a magnetic tunnel junction (MTJ) structure formed as part of a second stacked structure. The first stacked structure is bonded to the second stacked structure in a face-to-face manner. As such, the MTJ structure is grown as bottom pinned, and a top pinned stack with strong SAF layer is produced after flipping and bonding the second stacked structure to the first stacked structure. By utilizing such bonding process, this enables improved device performance without requiring changes to the device, and the front end transistor and back end MTJ wafer may be processed separately, which enables independent optimization of each wafer. Overall, the semiconductor device can realize the advantages of a top pinned stack, while simultaneously benefiting from the growth of a strong SAF on the seed layer. As compared with bottom pinned MTJ structures, the size of the transistor can be shrunk leading to increased density of the MRAM array.

In accordance with some embodiments of the present disclosure, a semiconductor device includes a first substrate, a transistor, an interconnection structure, a first bonding pad, a magnetic tunnel junction (MTJ) structure, a conductive line and a second substrate. The transistor is formed on the first substrate. The interconnection structure is formed on the first substrate and electrically connected to the transistor. The first bonding pad is formed on and electrically connected to the interconnection structure. The MTJ structure is disposed on and electrically connected to the first bonding pad, wherein the MTJ structure comprises a free layer, a tunnel barrier layer, a synthetic antiferromagnet layer sequentially stacked up over the first bonding pad. The conductive line is disposed on the MTJ structure. The second substrate is disposed on the conductive line.

In accordance with some other embodiments of the present disclosure, a semiconductor device includes a first stacked structure and a second stacked structure bonded to the first stacked structure. The first stacked structure includes a first substrate, transistors, and a plurality of conductive layers. The transistors are formed on the first substrate. The conductive layers are disposed on the first substrate and electrically connected to the transistors. The second stacked structure includes a second substrate, a magnetic tunnel junction (MTJ) structure, a seed layer, and a plurality of second conductive layers. The MTJ structure is disposed on the second substrate and includes a free layer, a tunnel barrier layer and a synthetic antiferromagnet layer, wherein the tunnel barrier layer is located in between the free layer and the synthetic antiferromagnet layer. The seed layer is located in between the second substrate and the synthetic antiferromagnet layer. The second conductive layers are disposed on the second substrate and electrically connected to the MTJ structure, wherein the second conductive layers are located in between the first stacked structure and the free layer of the MTJ structure.

In accordance with yet another embodiment of the present disclosure, a method of fabricating a semiconductor device is described. The method includes the following steps. A first stacked structure is formed by: providing a first substrate; forming transistors on the first substrate; and forming a plurality of conductive layers on the first substrate and electrically connected to the transistors. A second stacked structure is formed by: providing a second substrate having a through substrate via; forming a seed layer on the second substrate and connected to the through substrate via; forming a magnetic tunnel junction (MTJ) structure on the second substrate and over the seed layer, wherein the MTJ structure comprises a free layer, a tunnel barrier layer and a synthetic antiferromagnet layer, and wherein the tunnel barrier layer is located in between the free layer and the synthetic antiferromagnet layer, and the seed layer is located in between the second substrate and the synthetic antiferromagnet layer; and forming a plurality of second conductive layers on the second substrate and electrically connected to the MTJ structure. The second stacked structure is bonded to the first stacked structure, wherein after bonding the second stacked structure to the first stacked structure, the plurality of second conductive layers of the second stacked structure is located in between the first stacked structure and the free layer of the MTJ structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first substrate;
   a transistor formed on the first substrate;
   an interconnection structure formed on the first substrate and electrically connected to the transistor;
   a first bonding pad formed on and electrically connected to the interconnection structure;
   a magnetic tunnel junction (MTJ) structure disposed on and electrically connected to the first bonding pad, wherein the MTJ structure comprises a free layer, a tunnel barrier layer, a synthetic antiferromagnet layer sequentially stacked up over the first bonding pad;
   a conductive line disposed on the MTJ structure;
   a second substrate disposed on the conductive line; and
   a through substrate via disposed in the second substrate and electrically connected to the conductive line.

2. The semiconductor device according to claim 1, further comprising a seed layer sandwiched in between the conductive line and the synthetic antiferromagnet layer of the MTJ structure.

3. The semiconductor device according to claim 2, wherein the seed layer includes a material selected from the group consisting of platinum (Pt), tantalum (Ta), nickel-chromium (NiCr), nickel (Ni), chromium (Cr), and titanium-copper alloys.

4. The semiconductor device according to claim 1, further comprising a capping layer disposed in between the free layer and the first bonding pad.

5. The semiconductor device according to claim 1, further comprising:

a second bonding pad directly bonded to the first bonding pad; and a second interconnection structure electrically connecting the second bonding pad to the MTJ structure.

6. The semiconductor device according to claim 1, further comprising:

a contact pad disposed on the through substrate via; and a conductive bump disposed on the contact pad.

7. The semiconductor device according to claim 1, further comprising:

a plurality of first dielectric layers surrounding conductive layers of the interconnection structure and surrounding the first bonding pad;

a plurality of second dielectric layers surrounding the MTJ structure and the conductive line; and an encapsulant disposed on the plurality of first dielectric layers and encapsulating the plurality of second dielectric layers and the second substrate.

8. The semiconductor device according to claim 1, further comprising:

a top electrode disposed in between the MTJ structure and the interconnection structure, and electrically connected to the MTJ structure; and a top conductive layer disposed in between the top electrode and the interconnection structure, and electrically connected to the top electrode.

9. A semiconductor device, comprising:

a first stacked structure, wherein the first stacked structure comprises:

a first substrate;

transistors formed on the first substrate; and a plurality of conductive layers disposed on the first substrate and electrically connected to the transistors;

a second stacked structure bonded to the first stacked structure, wherein the second stacked structure comprises:

a second substrate;

a magnetic tunnel junction (MTJ) structure disposed on the second substrate and comprising a free layer, a tunnel barrier layer and a synthetic antiferromagnet layer, wherein the tunnel barrier layer is located in between the free layer and the synthetic antiferromagnet layer;

a seed layer located in between the second substrate and the synthetic antiferromagnet layer;

a conductive line located in between the seed layer and the second substrate;

a through substrate via disposed in the second substrate and electrically connected to the conductive line; and a plurality of second conductive layers disposed on the second substrate and electrically connected to the MTJ structure, wherein the plurality of second conductive layers is located in between the first stacked structure and the free layer of the MTJ structure.

10. The semiconductor device according to claim 9, wherein the first stacked structure further comprises a first bonding pad electrically connected to the plurality of conductive layers, and the second stacked structure further comprises a second bonding pad electrically connected to the plurality of second conductive layers, and the second stacked structure is bonded to the first stacked structure by directly bonding the first bonding pad to the second bonding pad.

11. The semiconductor device according to claim 10, wherein the first stacked structure further comprises a first bonding via electrically connecting the first bonding pad to the plurality of conductive layers, and the second stacked structure further comprises a second bonding via electrically connecting the second bonding pad to the plurality of second conductive layers, and wherein a lateral dimension of the first bonding via increases along a first direction, and a lateral dimension of the second bonding via decreases along the first direction.

12. The semiconductor device according to claim 9, wherein the second stacked structure further comprises a capping layer located in between the plurality of second conductive layers and the free layer of the MTJ structure.

13. The semiconductor device according to claim 9, further comprising:

a contact pad disposed on the through substrate via; and a conductive bump disposed on the contact pad.

14. The semiconductor device according to claim 9, wherein the first stacked structure is part of a semiconductor wafer, and the semiconductor device comprises a plurality of semiconductor chips disposed on the semiconductor wafer, and each of the plurality of semiconductor chips includes the second stacked structure.

15. The semiconductor device according to claim 9, wherein the first stacked structure is part of a semiconductor wafer and the second stacked structure is part of another semiconductor wafer, and sidewalls of the first substrate is aligned with sidewalls of the second substrate.

16. The semiconductor device according to claim 9, wherein the plurality of conductive layers, the plurality of second conductive layers, the MTJ structure, and the conductive line are vertically stacked up in sequence over the first substrate along a stacking direction.

17. A method of fabricating a semiconductor device, comprising:

forming a first stacked structure, which comprises:

providing a first substrate;

forming transistors on the first substrate; and forming a plurality of conductive layers on the first substrate and electrically connected to the transistors;

forming a second stacked structure, which comprises:

providing a second substrate having a through substrate via disposed therein;

forming a conductive line on the second substrate and electrically connected to the through substrate via;

forming a seed layer on the second substrate and connected to the through substrate via, wherein the conductive line is located in between the seed layer and the second substrate;

forming a magnetic tunnel junction (MTJ) structure on the second substrate and over the seed layer, wherein the MTJ structure comprises a free layer, a tunnel barrier layer and a synthetic antiferromagnet layer, and wherein the tunnel barrier layer is located in between the free layer and the synthetic antiferromagnet layer, and the seed layer is located in between the second substrate and the synthetic antiferromagnet layer; and forming a plurality of second conductive layers on the second substrate and electrically connected to the MTJ structure;

bonding the second stacked structure to the first stacked structure, wherein after bonding the second stacked structure to the first stacked structure, the plurality of second conductive layers of the second stacked structure is located in between the first stacked structure and the free layer of the MTJ structure.

18. The method according to claim 17, wherein forming the first stacked structure further comprises forming a first bonding pad electrically connected to the plurality of conductive layers, and forming the second stacked structure further comprises forming a second bonding pad electrically connected to the plurality of second conductive layers, and the second stacked structure is bonded to the first stacked structure by directly bonding the first bonding pad to the second bonding pad.

19. The method according to claim 17, wherein forming the second stacked structure further comprises forming a capping layer located in between the plurality of second conductive layers and the free layer of the MTJ structure.

20. The method according to claim 17, wherein after bonding the second stacked structure to the first stacked structure, the method further comprises:

forming a contact pad on the through substrate via; and forming a conductive bump on the contact pad.

* * * * *